United States Patent
Tseng

[11] Patent Number: 5,824,592
[45] Date of Patent: Oct. 20, 1998

[54] METHOD FOR FORMING A STACKED CAPACITOR OF A DRAM CELL

[75] Inventor: Horng-Huei Tseng, Hsinchu, Taiwan

[73] Assignee: Vanguard International Semiconductor Corporation, Hsinchu, Taiwan

[21] Appl. No.: 984,388

[22] Filed: Dec. 3, 1997

[51] Int. Cl.$^6$ .................................................. H01L 21/20
[52] U.S. Cl. .......................... 438/396; 438/253; 438/255; 438/398
[58] Field of Search .................................. 438/253, 254, 438/255, 256, 396, 397, 398, 399

[56] References Cited

U.S. PATENT DOCUMENTS

| | | | |
|---|---|---|---|
| 5,429,980 | 7/1995 | Yang et al. | 438/396 |
| 5,656,532 | 8/1997 | Tseng | 438/253 |
| 5,670,406 | 9/1997 | Tseng | 438/396 |
| 5,723,373 | 3/1998 | Chang et al. | 438/253 |

*Primary Examiner*—Tuan H. Nguyen
*Attorney, Agent, or Firm*—Christensen, O'Connor, Johnson & Kindness PLLC

[57] ABSTRACT

A method for forming a capacitor of a dynamic random access memory cell is disclosed. The method includes forming a polysilicon layer (124) over a semiconductor layer, wherein at least a portion of the polysilicon layer is communicated to the substrate, and then patterning to etch a portion of the polysilicon layer. A mask layer (126) is formed on a portion of the polysilicon layer, and at least one silicon oxide region (128A) is formed in the polysilicon not covered by the mask layer. After etching a portion of the polysilicon layer using the silicon oxide region as an etch mask, a capacitor dielectric layer (136) is formed on the polysilicon layer, and a conductive layer (138) is formed on the capacitor dielectric layer.

5 Claims, 5 Drawing Sheets

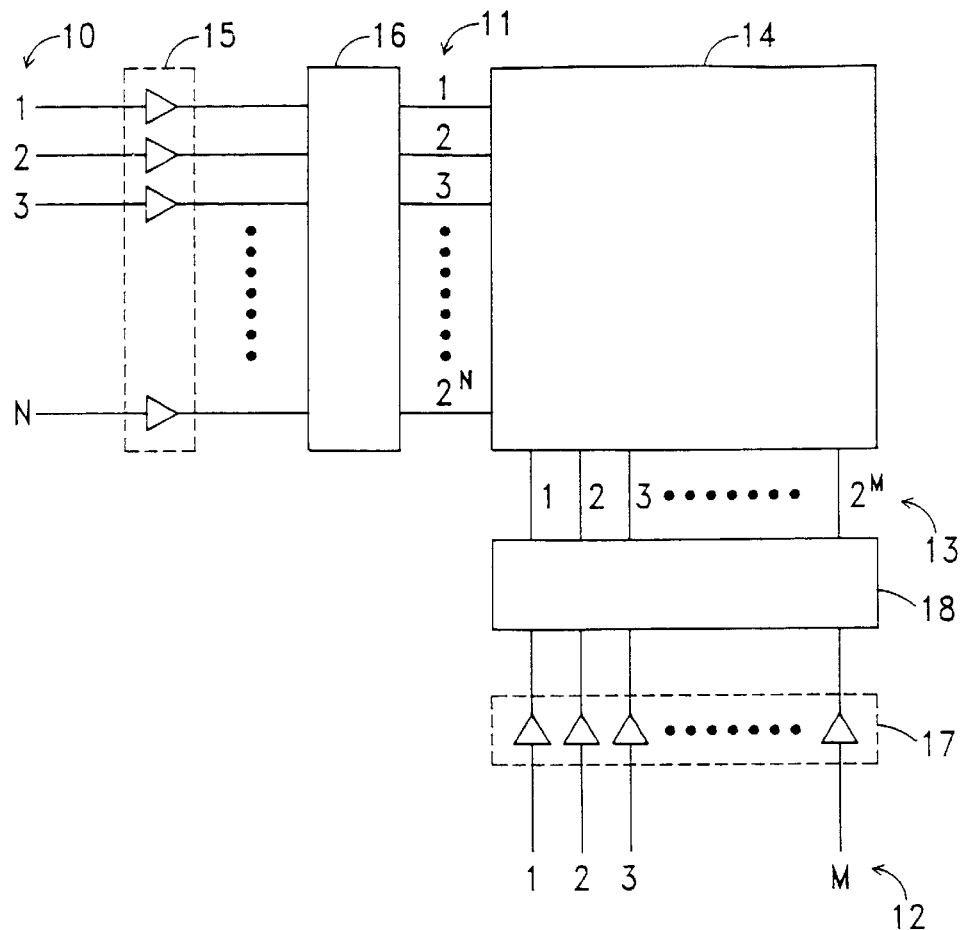
FIG.1
(Prior Art)
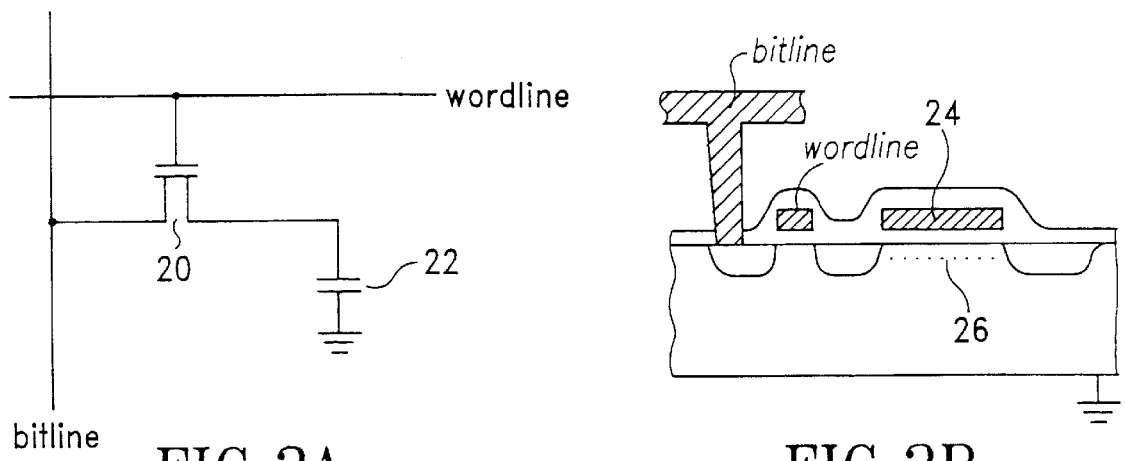
FIG.2A
(Prior Art)
FIG.2B
(Prior Art)

METHOD FOR FORMING A STACKED CAPACITOR OF A DRAM CELL

FIELD OF THE INVENTION

The present invention relates to fabrication of dynamic random access memories (DRAMs) fabrication, and more particularly, to a method for forming a capacitor in a dynamic random access memory cell.

BACKGROUND OF THE INVENTION

The growth in the popularity of electronic equipment, such as desktop and notebook computers, has increased the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

A row address 10 and a column address 12 are used to identify a location in the memory 14. A row address buffer 15 and a column address buffer 17, respectively, receive signals from row address 10 and signals from column address 12. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to its low cost per bit, high device density and flexibility of use for reading and writing operations.

Previous DRAMs used storage cells where each cell consisting of three transistors and were manufactured using a P-type channel metal-oxide-semiconductor (PMOS) technology. Subsequently, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows the cross section of a traditional one-transistor DRAM storage cell that uses a polysilicon layer 24 as one plate of the capacitor 22. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor 22 is reduced owing to its smaller electrode surface area. However, a relatively large capacitance is required to achieve a high signal-to-noise ratio in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the capacitor's capacitance while maintaining the small area occupied on the substrate surface. Consequently, this type of capacitor has come to be widely used in DRAM devices.

SUMMARY OF THE INVENTION

In accordance with the present invention, a method is provided for forming a capacitor of a dynamic random access memory cell that substantially increases the surface of the capacitor. In one embodiment, a first dielectric layer is formed on a semiconductor substrate, and the first dielectric layer is then patterned to form a node contact therein, and therefore exposing a portion of the substrate. A polysilicon layer is formed on the first dielectric layer, and the polysilicon layer also fills the node contact in the first dielectric layer. After a photoresist layer is formed on the polysilicon layer, the polysilicon layer is etched using the photoresist layer as a mask. A portion of the photoresist layer is laterally eroded, followed by implanting oxygen atoms into the polysilicon layer using the eroded photoresist layer as a mask. Two oxygen regions are formed in the polysilicon layer. The polysilicon layer is then annealed to convert the oxygen regions into silicon oxide regions, and a portion of the polysilicon layer is etched using the silicon oxide regions as an etch mask. A second dielectric layer is then formed on the polysilicon layer, and a conductive layer is formed on the second dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 shows a simplified diagram illustrative of the organization of a typical large semiconductor memory;

FIG. 2A shows a circuit schematic diagram of a typical one-transistor dynamic random access memory (DRAM) cell;

FIG. 2B shows a cross-sectional view illustrative of traditional one-transistor DRAM storage cell.

DETAILED DESCRIPTION OF THE PREFERRED EMBODIMENT

Figure 3:
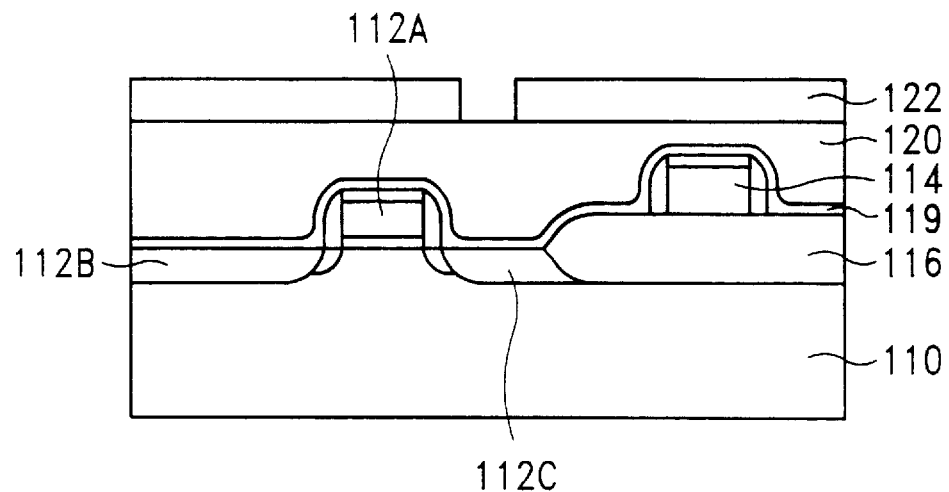
FIGS. 3–9 show cross-sectional views illustrative of various stages in the fabrication of a DRAM capacitor in accordance with the present invention.
Figure 4:
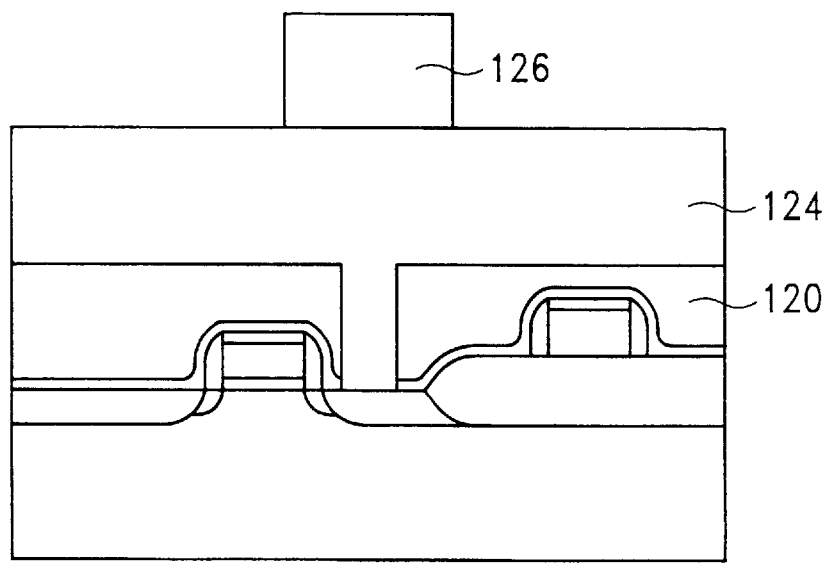

Referring to FIG. 3, a metal-oxide-semiconductor field effect transistor (MOSFET) having a gate 112A, a drain 112B and a source 112C, is conventionally formed in and on the substrate 110. A field oxide (FOX) region 116 is conventionally formed in the substrate 110 adjacent to the MOSFET for isolation purposes. A word line 114 is formed on the FOX region 116. In this embodiment, the MOSFET is an n-channel MOSFET that forms part of a DRAM cell.

A thin dielectric layer 119, such as an undoped oxide layer, is conformably deposited over the substrate 110 to a thickness, for example, of about 1000–2000 angstroms. A dielectric layer 120, such as a doped silicon oxide layer or boro-phosphosilicate glass (BPSG), is deposited over the thin dielectric layer 119 using a conventional low pressure chemical vapor deposition (LPCVD) or plasma enhanced chemical vapor deposition (PECVD) process. The thickness of this silicon oxide layer 120 ranges from about 3000 to 6000 angstroms.

The silicon oxide layer 120 is then planarized using any suitable conventional method such as an etch back process or a chemical mechanical polishing (CMP) process. A photoresist layer 122 is then formed and patterned on the silicon oxide layer 120 using conventional photolithographic techniques, defining a storage node contact area over a portion of the source 112C. A doped polysilicon layer 124 is then formed on the silicon oxide layer 120, and therefore filling the node contact in the silicon oxide layer 120. In this embodiment, the polysilicon layer 124 is deposited using a standard chemical vapor deposition process to a thickness of about 1000–10000 angstroms above the surface of the silicon oxide layer 120. Another photoresist layer 126 is then formed and patterned on the doped polysilicon layer 124 using conventional photolithographic techniques, defining a pattern over the node contact. This pattern is larger than and approximately aligned with the node contact area.

Figure 5:
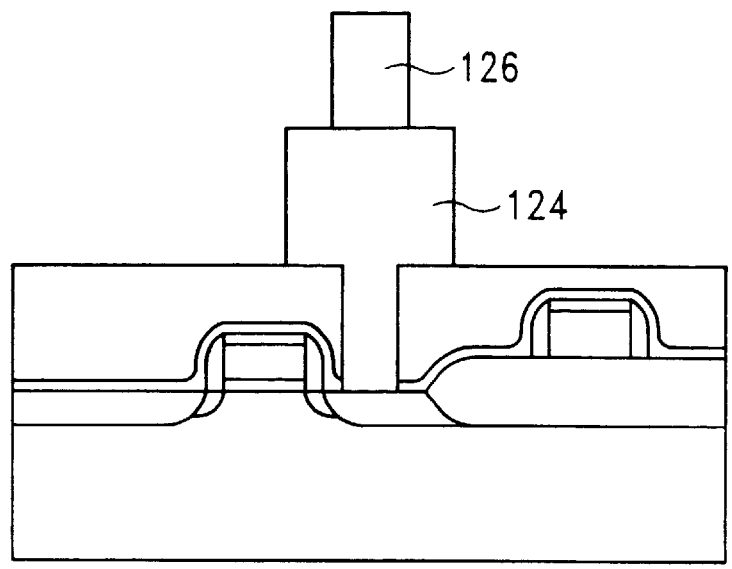

The doped polysilicon layer 124 is etched back using the photoresist layer 126 as a mask, for example, by a plasma etch process such as reactive ion etch (RIE), and therefore forming the structure as shown in FIG. 5. The photoresist layer 126 is subjected to a lateral erosion, and thereby exposing a portion of the surface of the doped polysilicon layer 124 as shown in FIG. 5.

Figure 6:
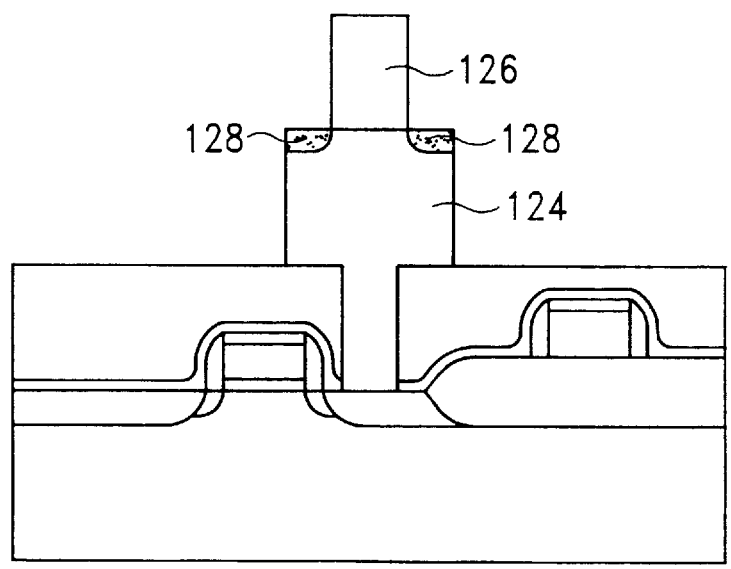
Figure 7:
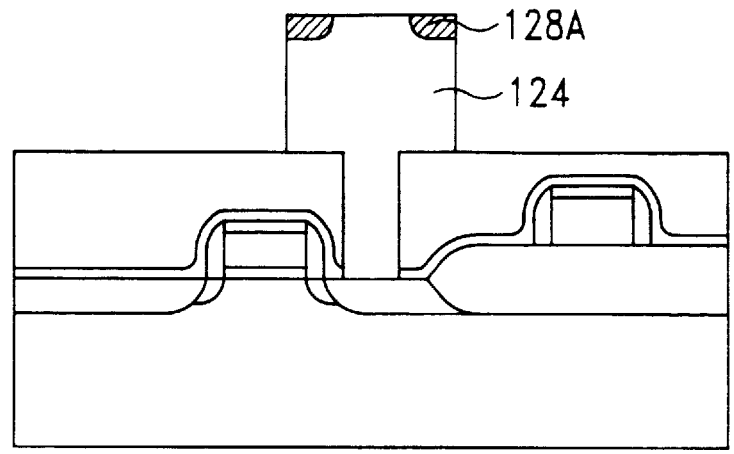

The structure of FIG. 5 is then subjected to oxygen implantation until oxygen regions 128 are formed inside and near the top surface of the doped polysilicon layer 124 as shown in FIG. 6. After the photoresist layer 126 is removed, the structure of FIG. 6 is thermally annealed, for example, by a rapid thermal process (RTP) or a furnace in an inert gas ambient to convert the oxygen regions 128 into silicon oxide regions 128A as shown in FIG. 7. In this embodiment, the annealing temperature is about 100°–1000° C.

Figure 8:
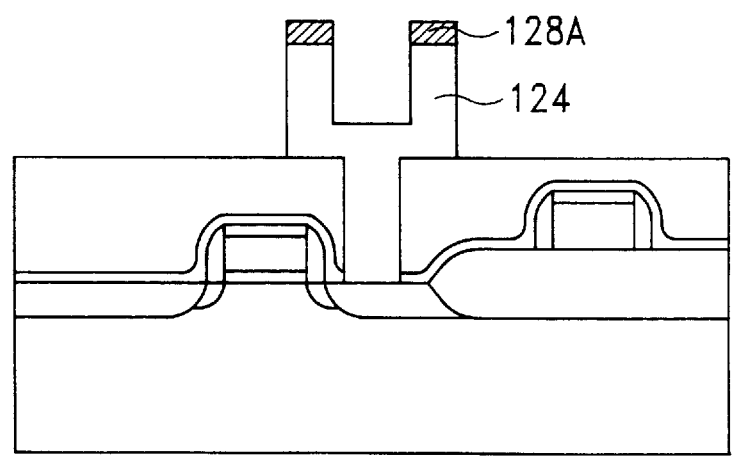

Referring to FIG. 8, a portion of the doped polysilicon layer 124 is then etched using the silicon oxide regions 128A as an etch mask, resulting in a crown-shaped profile as shown in FIG. 8. The doped polysilicon layer 124 serves as the storage node for the stacked capacitor of the DRAM cell.

Figure 9:
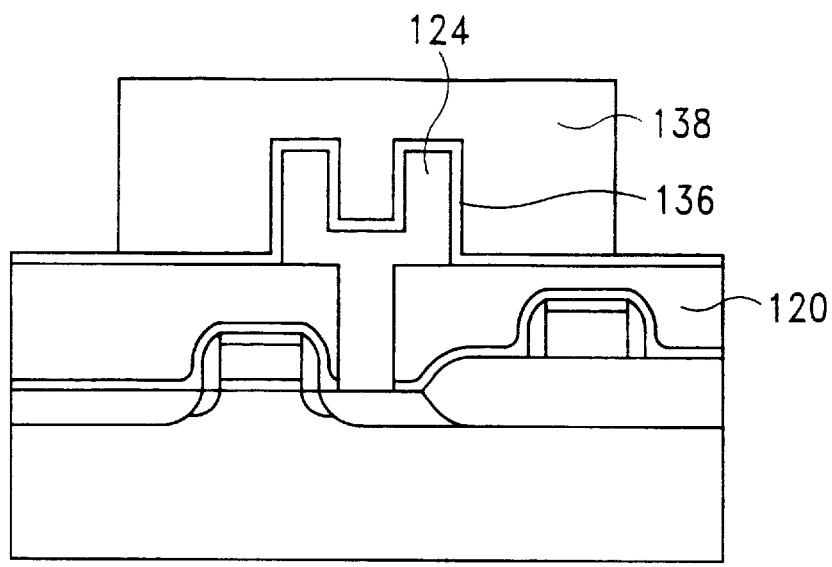

Referring to FIG. 9, after the silicon oxide regions 128A are removed, a dielectric film 136 and a top electrode 138 of the DRAM cell capacitor can be formed in a conventional manner. In this embodiment, a thin dielectric layer 136, such as a stacked oxide-nitride-oxide (ONO) film, is formed on the exposed surface of the bottom electrode (i.e., the storage node 124) and the surface of the silicon oxide layer 120. As is known in the art of DRAM fabrication, the ONO film is reliable over shaped silicon surfaces, and is typically used as a capacitor insulator. The bottom oxide layer of the stacked oxide-nitride-oxide (ONO) film 136 is conventionally formed by thermally oxidizing the silicon surface, depositing an LPCVD silicon nitride layer and then oxidizing the silicon nitride layer to form the top oxide layer. A conductive layer 138 is then deposited over the stack oxide/silicon nitride/oxide layer 136 to serve as an upper plate of the DRAM cell capacitor. The conductive layer 138 is typically a doped polysilicon layer formed in the same manner as the polysilicon layer 124.

Although specific embodiments have been illustrated and described, it will be obvious to those skilled in the art that various modifications may be made without departing from the spirit which is intended to be limited solely by the appended claims.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a capacitor of a dynamic random access memory cell, said method comprising:

forming a first dielectric layer on a semiconductor substrate;

patterning said first dielectric layer to form a node contact in said first dielectric layer, thereby exposing a portion of the substrate;

forming a polysilicon layer on said first dielectric layer, said polysilicon layer filling the node contact in said first dielectric layer;

forming a photoresist layer on said polysilicon layer;

etching said polysilicon layer using said photoresist layer as a mask;

laterally eroding a portion of said photoresist layer;

implanting oxygen atoms into said polysilicon layer using said eroded photoresist layer as a mask, thereby forming at least one oxygen region in said polysilicon layer;

annealing said polysilicon layer to convert said at least one oxygen region into at least one silicon oxide region;

etching a portion of said polysilicon layer using said at least one silicon oxide region as an etch mask;

forming a second dielectric layer on said polysilicon layer; and forming a conductive layer on said second dielectric layer.

2. The method according to claim 1, before forming said first dielectric layer, further comprising conformably forming a thin dielectric layer on the substrate.

3. The method according to claim 1, wherein said first dielectric layer comprises doped silicon oxide.

4. The method according to claim 1, wherein said polysilicon layer is annealed in a furnace.

5. The method according to claim 1, wherein said polysilicon layer is annealed by a rapid thermal process.

* * * * *